US010256225B2

(12) United States Patent
Klebanov et al.

(10) Patent No.: US 10,256,225 B2
(45) Date of Patent: Apr. 9, 2019

(54) GATE-LESS ELECTROSTATIC DISCHARGE SYSTEMS AND METHODS FOR FORMING

(71) Applicant: Allegro MicroSystems, LLC, Manchester, NH (US)

(72) Inventors: Maxim Klebanov, Waltham, MA (US); Washington Lamar, Mont Vernon, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/601,141

(22) Filed: May 22, 2017

(65) Prior Publication Data

US 2018/0337168 A1 Nov. 22, 2018

(51) Int. Cl.
| | |
|---|---|
| *H01L 27/02* | (2006.01) |
| *H01L 21/265* | (2006.01) |
| *H01L 21/762* | (2006.01) |
| *H01L 29/06* | (2006.01) |
| *H01L 29/87* | (2006.01) |
| *H01L 29/417* | (2006.01) |
| H01L 29/78 | (2006.01) |

(52) U.S. Cl.
CPC .... *H01L 27/0255* (2013.01); *H01L 21/26513* (2013.01); *H01L 21/76202* (2013.01); *H01L 21/76224* (2013.01); *H01L 29/0649* (2013.01); *H01L 29/0688* (2013.01); *H01L 29/417* (2013.01); *H01L 29/87* (2013.01); H01L 27/0259 (2013.01); H01L 29/7801 (2013.01)

(58) Field of Classification Search
None
See application file for complete search history.

(56) References Cited

U.S. PATENT DOCUMENTS

| | | | | |
|---|---|---|---|---|
| 5,293,057 | A * | 3/1994 | Ho | H01L 29/861 257/356 |
| 2007/0025034 | A1* | 2/2007 | Chaudhary | H01L 27/0266 361/56 |
| 2007/0034958 | A1* | 2/2007 | Kim | H01L 27/0259 257/355 |
| 2010/0328826 | A1* | 12/2010 | Salman | H01L 21/84 361/56 |

OTHER PUBLICATIONS

U.S. Appl. No. 15/481,882, filed Apr. 7, 2017, Klebanov, et al.

* cited by examiner

*Primary Examiner* — Bo B Jang
(74) *Attorney, Agent, or Firm* — Daly, Crowley, Mofford & Durkee, LLP (57) ABSTRACT

A gate-less electrostatic discharge (ESD) protection device is provided that can be formed in various complementary metal-oxide-semiconductor (CMOS) systems. The gate-less ESD event protection device includes a substrate, a first doped region formed in the substrate, a second doped region extending into the first doped region, a third doped region extending into the first doped region, a first node formed over a portion of the second doped region and coupled to a source terminal and a second node formed over the third doped region and coupled to a drain terminal. The gate-less ESD protection devices can be formed such that no gate electrode is formed and the gate-less ESD protection device does not include a gate terminal. Thus, an operating voltage range of the gate-less ESD protection device is not limited by gate oxide degradation.

23 Claims, 6 Drawing Sheets

FIG. 4

GATE-LESS ELECTROSTATIC DISCHARGE SYSTEMS AND METHODS FOR FORMING

BACKGROUND

As is known in the art, an electrostatic discharge (ESD) event is the sudden flow of electricity between two electrically charged objects, typically caused by contact, an electrical short, or dielectric breakdown. The ESD event can deliver a large amount of energy to different portions of an integrated circuit (IC), damaging various circuitry within the IC.

To provide protection from ESD events, IC's may use a grounded gate N-type metal-oxide-semiconductor (GGNMOS) clamp. However, the voltage operating range of a particular GGNMOS clamp is limited based on the properties of the different layers within the GGNMOS clamp. For example, the maximum direct current (DC) voltage that can be sustained by the GGNMOS clamp is limited to the breakdown between the drain and gate terminals. GGNMOS clamps include a gate oxide layer having a degradation factor that limits the voltage operating range of the GGNMOS clamps. Thus, due to the gate oxide degradation, the maximum sustained DC voltage between the drain and gate terminals is limited and thus, the voltage operating range of the GGNMOS is limited. For example, a GGNMOS structure having a 90 Å gate oxide is limited to a 3.6V operating range.

SUMMARY

Systems, methods, and techniques described here provide for gate-less electrostatic discharge (ESD) protection devices that can be formed in various complementary metal-oxide-semiconductor (CMOS) systems. The gate-less ESD protection devices can be formed such that no gate electrode is formed and the gate-less ESD protection device does not include a gate terminal. Thus, the gate-less ESD protection device is not limited to gate oxide degradation and includes an extended drain MOS-based (e.g., NMOS, PMOS) structure having an extended voltage operating range for ESD protection as compared to other ESD systems.

The gate-less ESD protection device can be formed from a MOS-based (e.g., NMOS, PMOS) structure. For example, multiple doped regions having different doping types (e.g., N-type, P-type) can be disposed or otherwise formed within a substrate (e.g., semiconductor substrate). The doped regions may alternate with respect to a doping type such that, in response to an ESD event, a bipolar transistor (e.g., NPN, PNP) forms within the substrate.

Drain and source terminals can be coupled to contact regions on the doped regions. However, in one embodiment, a gate electrode is not formed over an oxide layer and a gate terminal is not coupled to the gate-less ESD protection device. Thus, the gate-less ESD protection device can be formed having an extended operating range to allow it to be utilized in a CMOS applications requiring a higher voltage level.

A trigger voltage of the resultant gate-less ESD protection device that is formed can correspond to an avalanche breakdown voltage (BV) between the drain region and one or more of the other doped regions, and thus can be a function of the doping profile of the drain region and the one or more other doped regions. Thus, the trigger voltage threshold can correspond to a material of the one or more doped regions forming the gate-less ESD protection device and/or a doping level of the one or more doped regions.

In some embodiments, the trigger voltage threshold can correspond to geometry and/or location of each of the one or more doped regions with respect to each other. For example, in some applications, it may be desirable to bring the source region closer to the drain region, in which case that proximity may cause trigger voltage threshold to be determined by the punch-through from the drain region to the source region. Thus, the doping profiles of the one or more doped regions and the proximity of each of the one or more doped regions can impact the trigger voltage threshold. In some embodiments, a max voltage of the gate-less ESD protection device can be equal to or proportional to the trigger voltage threshold.

In a first aspect, a gate-less electrostatic discharge (ESD) event protection device includes a substrate, a first doped region formed in the substrate, a second doped region extending into the first doped region, a third doped region extending into the first doped region, a first node formed over a portion of the second doped region and coupled to a source terminal and a second node formed over the third doped region and coupled to a drain terminal, wherein the device does not include a gate electrode (i.e., no gate electrode formed over the channel region).

In some embodiments, the first doped region includes a first P-type region formed in the substrate, the second doped region includes a first N-type region extending into the first P-type region and the third doped region include a second N-type region extending into the first P-type region. The first node can be coupled to a first reference voltage and the second node coupled to a second reference voltage. The first reference voltage can be a ground terminal and the second reference voltage can be a voltage supply terminal.

The first P-type region and the first and second N-type regions may form a bipolar NPN transistor within the substrate in response to an ESD event. The first P-type region and the first and second N-type regions may form a current path from the first node to the second node in response to an ESD event having a voltage above a trigger voltage threshold.

The trigger voltage threshold can correspond to one or more of a material of the first doped region, a material of the second doped region, a material of the third doped region or a location of each of the first doped region, the second doped region and third doped region with respect to each other. The trigger voltage threshold can correspond to a doping level of one or more of the first doped region, a material of the second doped region, or a material of the third doped region.

The device may further include a second P-type region extending into the first P-type region and adjacent to the second N-type region. The second node can be formed over the second N-type region and the second P-type region.

The device may further include first and second isolation regions such that portions of the first and second isolation regions extend into the first P-type region and portions of the first and second isolation regions extend into the substrate. The first isolation region can be formed adjacent to the first N-type region and the second isolation region can be formed adjacent to the second P-type region. The first and second isolation regions may include at least one of a shallow trench isolation (STI) region or a local oxidation of silicon (LOCOS) region.

A first low doped drain (LDD) layer may extend into the first P-type region and adjacent to the first N-type region and a second LDD layer may extend into the first P-type region and adjacent to the second N-type region.

In some embodiments, the first doped region includes a first N-type region formed in the substrate, the second doped region includes a first P-type region extending into the first N-type region and the third doped region includes a second P-type region extending into the first N-type region. The first N-type region and the first and second P-type type regions may form a bipolar PNP transistor within the substrate in response to an ESD event. In an embodiment, the first N-type region and the first and second P-type regions may form a current path from the second node to the first node in response to an ESD event having a voltage above a trigger voltage threshold.

The device may further include a second N-type region extending into the first N-type region and adjacent to the second P-type region. The second node can be formed over the second P-type region and the first N-type region.

In another aspect, a method for forming a gate-less electrostatic discharge (ESD) event protection device includes forming a first doped region in a substrate, implanting a second doped region into the first doped region, implanting a third doped region into the first doped region, forming a first node over a portion of the second doped region and coupled to a source terminal, and forming a second node over the third doped region and coupled to a drain terminal, wherein the device does not include a gate electrode formed between the second and third doped regions.

The first doped region may include a first P-type region, the second doped region may include a first N-type region implanted into the first P-type region, and the third doped region may include a second N-type region implanted into the first P-type region.

The method may further include coupling the first node to a first reference voltage and coupling the second node to a second reference voltage. In an embodiment, responsive to an ESD event, a bipolar NPN transistor can be formed within the substrate using the first P-type region and first and second N-type regions. For example, responsive to an ESD event, a current path may be formed from the first node to the second node using the first P-type region and first and second N-type regions, wherein the ESD event includes a voltage above a trigger voltage threshold.

A second P-type region may be formed extending into the first P-type region and adjacent to the second N-type region. The second node may be formed over the second N-type region and the second P-type region.

The method may further include forming first and second isolation regions such that portions of the first and second isolation regions extend into the first P-type region and portions of the first and second isolation regions extend into the substrate. The first isolation region can be formed adjacent to the first N-type region and the second isolation region can be formed adjacent to the second P-type region. The first and second isolation regions may include at least one of a STI region or a LOCOS region.

A first LDD layer may be implanted into the first P-type region and adjacent to the first N-type region and a second LDD layer may be implanted into the first P-type region and adjacent to the second N-type region.

In some embodiments, the first doped region includes a first N-type region, the second doped region includes a first P-type region implanted into the first N-type region, and the third doped region includes a second P-type region implanted into the first N-type region.

The first node can be coupled to a first reference voltage and the second node can be coupled to a second reference voltage. The first reference voltage can correspond to a ground terminal and the second reference voltage can correspond to a supply voltage terminal.

The method may further include, responsive to an ESD event, forming a form a bipolar PNP transistor within the substrate using the first N-type region and first and second P-type regions. In some embodiments, responsive to an ESD event, a current path may be formed from the second node to the first node using the first N-type region and first and second P-type regions, wherein the ESD event includes a voltage above a trigger voltage threshold.

A second N-type region may be formed extending into the first N-type region and adjacent to the second P-type region. The second node may be formed over the second P-type region and the second N-type region.

In another aspect, an electrostatic discharge (ESD) event protection circuit includes a first gate-less ESD event protection device having a first terminal coupled to an input/output (I/O) terminal of the circuit and a second terminal coupled to a reference voltage, a second gate-less ESD protection device having a first terminal coupled to a power supply and a second terminal coupled to the reference voltage, and a circuit arrangement disposed between the first and second gate-less ESD event protection devices such that the first terminal of the first gate-less ESD event protection device is coupled to an input of the circuit arrangement and the first terminal of the second gate-less ESD event protection device is coupled to an output of the circuit arrangement. Each of the first and second gate-less ESD protection devices do not include a gate electrode.

The circuit arrangement may include one or more complementary metal oxide semiconductor (CMOS) devices, one or more bipolar devices, one or more double diffused metal oxide semiconductor (DMOS) devices, or one or more Hall-effect or magnetoresistance elements.

The first gate-less ESD event protection device can be positioned to drain current associated with an ESD event on the I/O terminal and the second gate-less ESD event protection device can be positioned to drain current associated with an ESD event on the power supply.

In some embodiments, each of the first and second gate-less ESD protection devices include a substrate, a first P-type region formed in the substrate, a first N-type region extending into the first P-type region, a second N-type region extending into the first P-type region, a first node formed over the first N-type region and coupled to a source terminal, and a second node formed over the second N-type region and coupled to a drain terminal.

In an embodiment, in each of the first and second gate-less ESD protection devices, the first P-type region and first and second N-type regions can form a bipolar NPN transistor within the substrate in response to an ESD event. In some embodiments, in each of the first and second gate-less ESD protection devices, the first P-type region and first and second N-type regions form a current path from the first node to the second node in response to an ESD event having a voltage above a trigger voltage threshold.

In each of the first and second gate-less ESD protection devices, a second P-type region may extend into the first P-type region and adjacent to the second N-type region. The second node can be formed over the second N-type region and the second P-type region.

In an embodiment, each of the first and second gate-less ESD protection devices, may include first and second isolation regions such that portions of the first and second isolation regions extend into the first P-type region and portions of the first and second isolation regions extend into the substrate. The first isolation region can be formed adjacent to the first N-type region and the second isolation region can be formed adjacent to the second P-type region.

The first and second isolation regions include at least one of a field oxide region, STI region or a LOCOS region.

In each of the first and second gate-less ESD protection devices, a first LDD layer can extend into the first P-type region and adjacent to the first N-type region and a second LDD layer can extend into the first P-type region and adjacent to the second N-type region.

In some embodiments, each of the first and second gate-less ESD protection devices may include a substrate, a first N-type region formed in the substrate, a first P-type region extending into the first N-type region, a second P-type region extending into the first N-type region, a first node formed over the first P-type region and coupled to a source terminal, and a second node formed over the second P-type region and coupled to a drain terminal.

The first N-type region and first and second P-type regions can form a bipolar PNP transistor within the substrate in response to an ESD event. The first N-type region and first and second P-type regions can form a current path from the second node to the first node in response to an ESD event having a voltage above a trigger voltage threshold.

In another aspect, a gate-less electrostatic discharge (ESD) event protection device includes a substrate and a means for providing a current path in the substrate from a first node to a second node in response to an ESD event having a voltage above a trigger voltage threshold. The means for providing the current path may include a first doped region, a second doped region extending into the first doped region, and a third doped region extending into the first doped region. The first node can be formed over the second doped region and coupled to a source terminal, the second node can be formed over the third doped region and coupled to a drain terminal, and the device does not include a gate electrode.

The means for providing a current path further may include a bipolar transistor formed from the first, second and third portions in response to an ESD event. The trigger voltage threshold can correspond to one or more of a material of the first doped region, a material of the second doped region, a material of the third doped region or a location of each of the first doped region, the second doped region and third doped region with respect to each other. In some embodiments, the trigger voltage threshold can correspond a doping level of one or more of the first doped region, a material of the second doped region, or a material of the third doped region.

The details of one or more embodiments of the disclosure are set forth in the accompanying drawings and the description below. Other features, objects, and advantages of the disclosure will be apparent from the description and drawings, and from the claims.

DETAILED DESCRIPTION

Described herein are techniques to form a device with an embedded gate-less electrostatic discharge (ESD) protection device bipolar transistor. At a semiconductor device level, an ESD event may exert a voltage much higher than the maximum voltage rating of the device, and consequently may induce an electrical breakdown via avalanche of carriers, a chain reaction of generating a lot of holes and electrons, or may further induce latch-up. The magnitude, duration and repetition of such an event may create permanent physical damages and a failure of the device. A gate-less ESD protection device may be used in integrated circuits to protect the integrated circuits from ESD events.

The gate-less electrostatic discharge (ESD) protection devices described herein can be formed in various complementary metal-oxide-semiconductor (CMOS) systems. The gate-less ESD event protection device includes a substrate, a first doped region formed in the substrate, a second doped region extending into the first doped region, a third doped region extending into the first doped region, a first node formed over a portion of the second doped region and coupled to a source terminal and a second node formed over the third doped region and coupled to a drain terminal. The gate-less ESD protection devices can be formed such that no gate electrode is formed and the gate-less ESD protection device does not include a gate terminal. Thus, an operating voltage range of the gate-less ESD protection device is not limited to gate oxide degradation.

Figure 1:
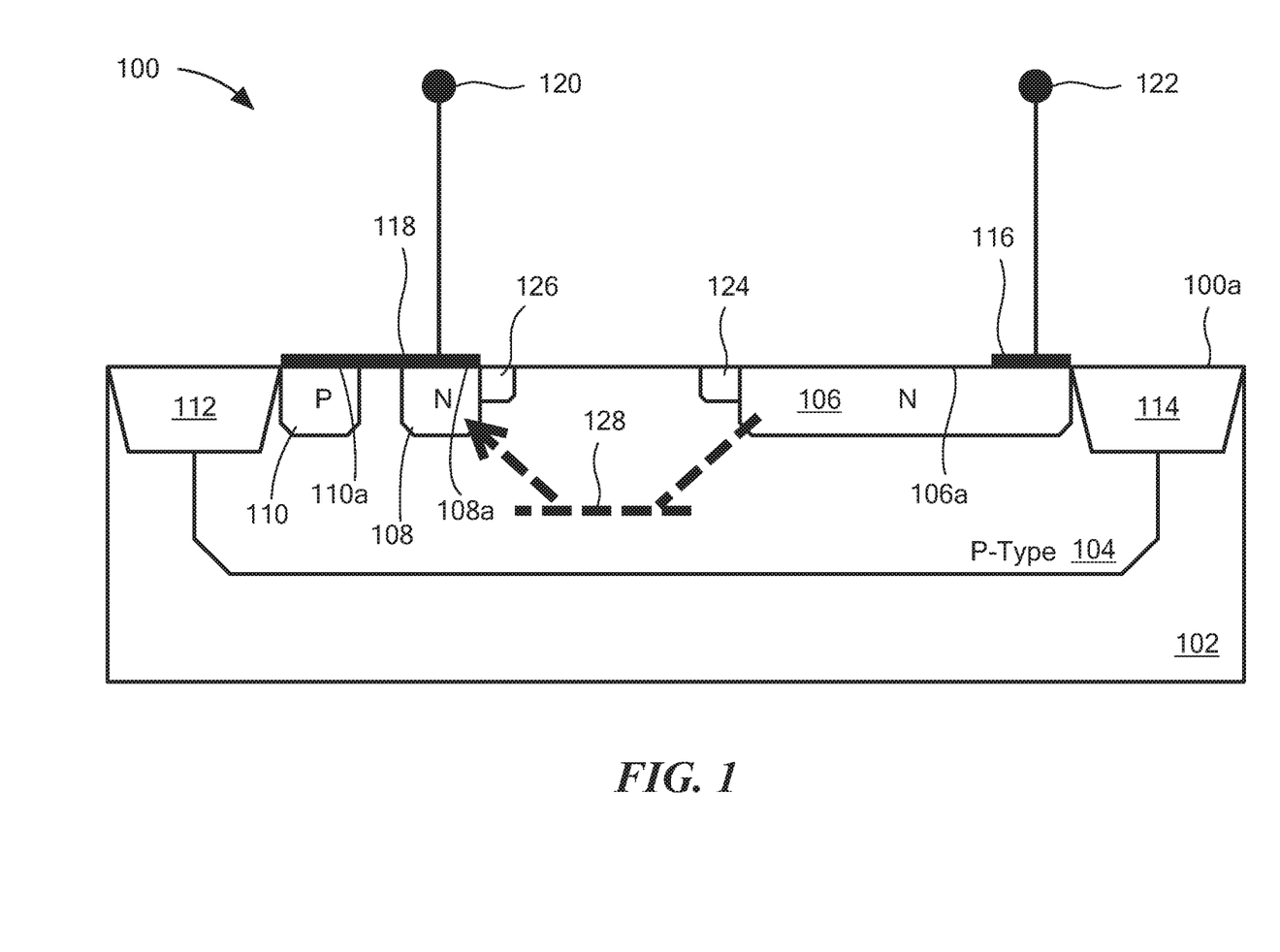
FIG. 1 is a block diagram of a gate-less N-type metal-oxide-semiconductor (NMOS) electrostatic discharge (ESD) protection structure.

Now referring to FIG. 1, a gate-less electrostatic discharge (ESD) event protection device 100 includes a substrate 102 (e.g., semiconductor substrate) and a first doped region (here a P-type region) 104 formed in the substrate 102. ESD device 100 further includes a second doped region (here a first N-type region) 108 extending into first doped region 104, a third doped region (here a second N-type region) 106 extending into first doped region 104, and a fourth doped region (here a second P-type region) 110 extending into first doped region 104.

Each of the doped regions as described herein may include either a N-type or P-type doped region of varying doping levels. For example, N-type regions may refer to at least one of an N(+) type region, an N(−) type region, N-type well or N-type epitaxial layer. P-type regions may refer to at least one of a P(+) type region, a P(−) type region, P-type well or P-type epitaxial layer. The type of region formed and/or the level of doping of the respective region can be based at least in part on a particular application of the respective gate-less ESD event protection device.

In this example embodiment, ESD device 100 is described below having an n-channel metal-oxide-semiconductor (NMOS) configuration. For example, first doped region includes a first P-type region 104 formed in the substrate 102, second doped region includes a first N-type region 108 extending into first P-type region 104, third doped region includes a second N-type region 106 extending into first P-type region and fourth doped region includes a second P-type region 110 extending into first P-type region 104. Each of second P-type region 110, first N-type region 108 and second N-type region 106 are formed along a first surface 100a of ESD device 100.

ESD protection device 100 includes first and second isolation regions 112, 114 formed along first surface 100a of ESD device 100. First isolation region 112 is formed such that portions of first isolation region 112 extend into substrate 102 and first P-type region 104. Second isolation region 114 is formed such that portions of second isolation region 114 extend into substrate 102 and first P-type region 104. Isolation regions may include at least one of a field oxide region, a shallow trench isolation (STI) region or a local oxidation of silicon (LOCOS) region.

In an embodiment, first and second isolation regions 112, 114 are formed on opposite sides (or portions) of ESD device 100. For example, first isolation region 112 is formed on a first side of ESD device 100 such that it is adjacent to second P-type region 110 and second isolation region 114 is formed on a second, opposite side of ESD device 100 such that it is adjacent to second N-type region 106.

A first low doped depletion (LDD) layer 126 is formed extending into first P-type region 104 and along first surface 100a of ESD device 100 such that it is adjacent to first N-type region 108. A second LDD layer 124 is formed extending into first P-type region 104 and along first surface 100a such that it is adjacent to second N-type region 106. First and second LDD layers 126, 124 may include N-type regions and may have a different doping level from first and second N-type regions 108, 106. In an embodiment, first and second LDD layers 126, 124 can be configured to mitigate hot carrier effects in ESD device 100. In the illustrative embodiment of FIG. 1, ESD device 100 includes an NMOS transistor, thus first and second LDD layers 126, 124 are N-type LDD layers. However, it should be appreciated that P-type LDD layers may be formed in PMOS transistors.

A first node 118 is formed over a first surface 110a of second P-type region 110 and a first surface 108a of first N-type region 108 and a second node 116 is formed over a portion of a first surface 106a of second N-type region 106. First node 118 may be coupled to a first terminal 120 (e.g., source terminal) and second node 116 may be coupled to a second terminal 122 (e.g., drain terminal).

First and second nodes 118, 116 may include silicide, such as but not limited to, cobalt silicide or titanium silicide. First and second terminals 120, 122 may include various types of metal or metallic materials.

In an embodiment, no gate oxide layer (e.g., no gate electrode) is formed over first surface 100a of ESD device 100 and ESD device 100 does not include a gate terminal. Thus, a voltage operating range of ESD device 100 is not limited by gate oxide degradation or by a drain-gate voltage. The voltage operating range of ESD device 100 can be extended beyond that of an ESD device having a gate terminal.

Substrate 102 may include a semiconductor substrate. Substrate 102 may include any material suitable for supporting electronic circuitry. In some embodiments, the substrate may be comprised of a semiconductor material, including but not limited to silicon, germanium, gallium arsenide, and/or other types of semiconductor materials. In other embodiments, the substrate may be comprised of glass, ceramic, polymer and/or other materials that can support electronic circuitry and/or semiconductor materials. The substrate also may include both semiconductor and non-semiconductor materials. In some embodiments, substrate 102 may include, but not limited to, a semiconductor material disposed on at least one of glass, crystal (sapphire), ceramic, or polymer.

Figure 1A:
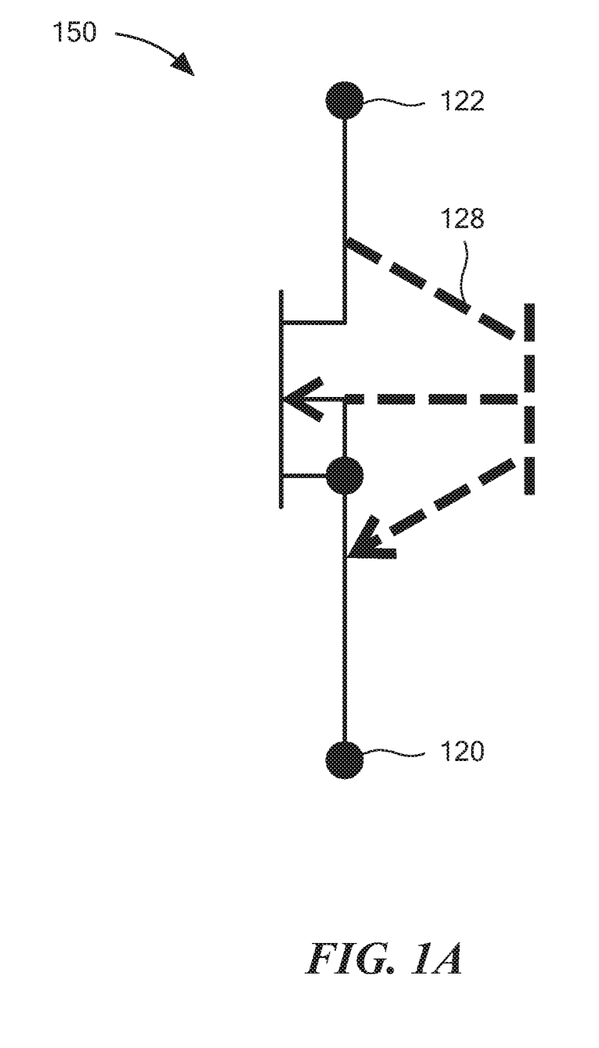
FIG. 1A is a diagram of a parasitic drain-body-source NPN arrangement formed with the ESD protection structure of FIG. 1.

In operation, in response to an ESD event, a bipolar NPN transistor may turn on or otherwise be activated in ESD device 100 and form a current path 128 from second N-type region 106 to first N-type region 108 through first P-type region 104. For example, and now referring to FIG. 1A, second terminal 122 (drain terminal) may be coupled to a second reference voltage (e.g., input/output terminal, supply voltage terminal) and first terminal 120 (source terminal) may be coupled to a first reference voltage (e.g., ground terminal).

The ESD event may occur on the input/output terminal or supply voltage terminal and may deliver a spike or high amount of energy to an integrated circuit that ESD device 100 is disposed within, potentially damage the circuitry within the IC. ESD device 100 can provide current path 128 to provide a safe path for current from the ESD event to flow away from drain terminal 122 through ESD device 100 to source terminal 120, and thus to the first reference voltage (e.g., ground terminal). In an embodiment, the current path 128 can re-route dangerous current away from circuitry and to, for example, ground.

ESD device 100 may have a trigger voltage threshold based at least in part of the properties of the materials of ESD device 100. Thus, for the bipolar transistor of ESD device 100 to be activated, a voltage associated with the ESD event may be greater than or equal to the trigger voltage threshold.

In some embodiments, the trigger voltage threshold of the resultant gate-less ESD protection device that is formed can correspond to an avalanche breakdown voltage (BV) between second N-type region 106 (i.e., drain region) and first P-type region 104. Thus, the trigger voltage threshold can be a function of the doping profile of second N-type region 106 and first P-type region 104. In an embodiment, the trigger voltage can correspond to a material of first P-type region 104, second P-type region 110, first N-type region 108 and/or second N-type region 106 and/or a doping level of first P-type region 104, second P-type region 110, first N-type region 108 and/or second N-type region 106.

The trigger voltage threshold can correspond to doping profiles, geometry and/or location of each of first P-type region 104, second P-type region 110, first N-type region 108 and/or second N-type region 106, as well as LDD regions 126, 124, with respect to each other. For example, in some applications, it may be desirable to bring first N-type region 108 (e.g., source region) closer in proximity to second N-type region 106 (e.g., drain region), in which case that proximity may cause trigger voltage threshold to be determined by the punch-through from first N-type region 108 to second N-type region 106. Thus, the doping profiles of the one or more doped regions and the proximity of each of the one or more doped regions can impact the trigger voltage threshold of ESD device 100. In some embodiments, a max voltage of ESD device 100 can be equal to or proportional to the trigger voltage threshold. It should be appreciated that other parameters of ESD device 100, such as, a holding voltage ($V_h$) of ESD device 100, a maximum current robustness of ESD device 100 and/or an on-resistance value of ESD device 100 can based at least in part on the doping profiles, geometry and/or location of each of first P-type region 104, second P-type region 110, first N-type region 108 and/or second N-type region 106, as well as LDD regions 126, 124, with respect to each other.

In one embodiment of ESD protection device 100, first doped region 140 may include a P type well region, second doped region 108 may include a N+ type region, third doped region 106 may include a N+ type region, and fourth doped region 110 may include a P+ type region.

It should be appreciated that in other embodiments, ESD device 100 may be provided having a p-channel metal-oxide-semiconductor (PMOS) configuration. For example, and referring to FIG. 1B, a gate-less electrostatic discharge (ESD) event protection device 150 includes a substrate 152 (e.g., semiconductor substrate) and a first doped region (here a N-type region) 154 formed in substrate 152. ESD device 100 further includes a second doped region (here a first P-type region) 158 extending into first doped region 154, a third doped region (here a second P-type region) 156 extending into first doped region 154, and a fourth doped region (here a second N-type region) 160 extending into first doped region 154.

Figure 1B:
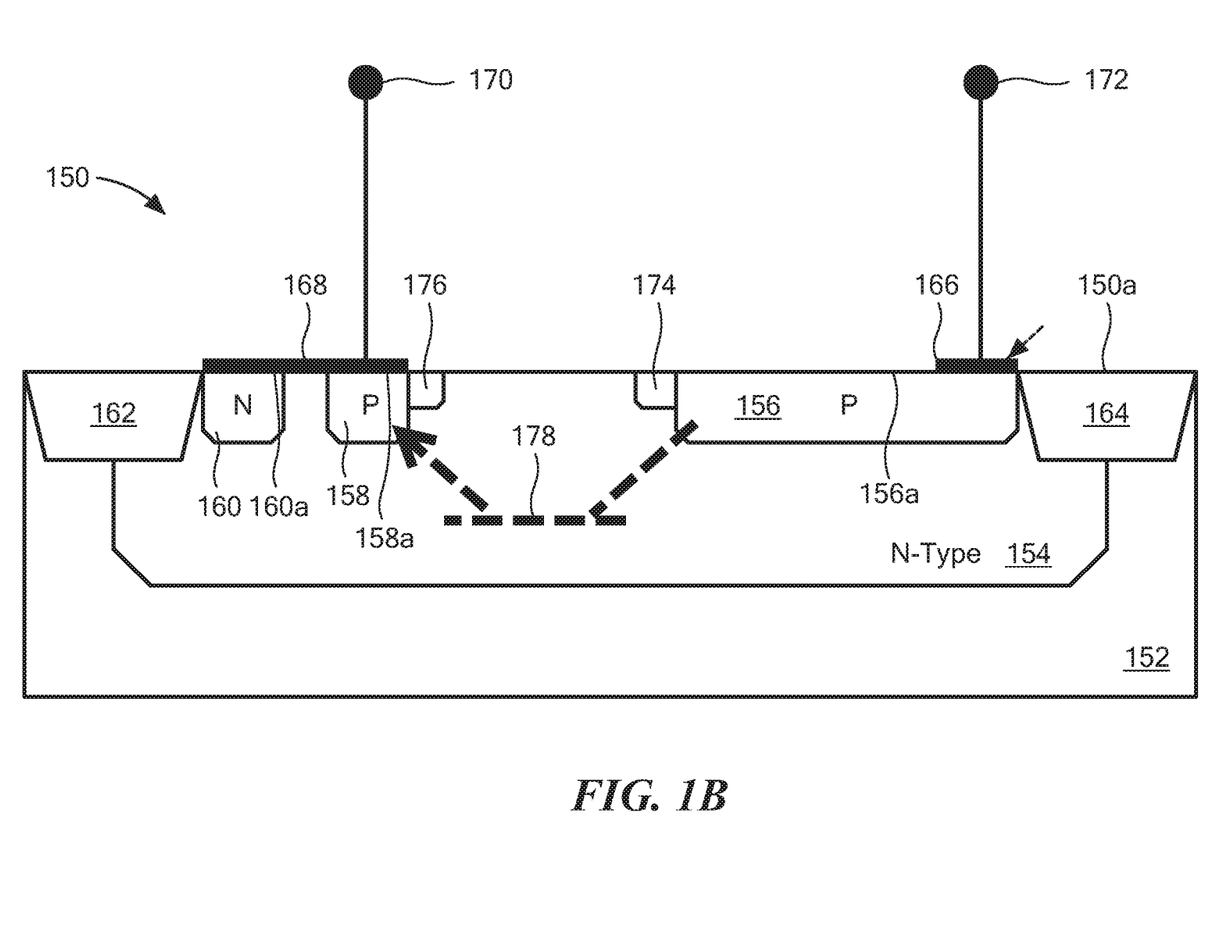
FIG. 1B is a block diagram of a gate-less P-type metal-oxide-semiconductor (PMOS) electrostatic discharge (ESD) protection structure.

In an embodiment, first doped region includes a first N-type region 154 formed in the substrate 152, second doped region includes a first P-type region 158 extending into first N-type region 154, third doped region includes a second P-type region 156 extending into first N-type region 154 and fourth doped region includes a second N-type region 160 extending into first N-type region 154. Each of second N-type region 160, first P-type region 158 and second P-type region 156 are formed along a first surface 150a of ESD device 150.

ESD protection device 150 includes first and second isolation regions 162, 164 formed along first surface 150a of ESD device 150. First isolation region 162 is formed such that portions of first isolation region 162 extend into substrate 152 and first N-type region 154. Second isolation region 164 is formed such that portions of second isolation region 164 extend into substrate 152 and first N-type region 154. Isolation regions 162, 164 may include at least one of a field oxide region, a STI region or a LOCOS region.

In an embodiment, first and second isolation regions 162, 164 are formed on opposite sides (or portions) of ESD device 150. For example, first isolation region 162 is formed on a first side of ESD device 150 such that it is adjacent to second N-type region 160 and second isolation region 164 is formed on a second, opposite side of ESD device 150 such that it is adjacent to second P-type region 156.

A first LDD layer 176 is formed extending into first N-type region 154 and along first surface 150a of ESD device 150 such that it is adjacent to first P-type region 158. A second LDD layer 174 is formed extending into first N-type region 154 and along first surface 150a such that it is adjacent to second P-type region 156.

A first node 168 is formed over a first surface 160a of second N-type region 160 and a first surface 158a of first P-type region 158 and a second node 166 is formed over a portion of a first surface 156a of second P-type region 156. First node 168 may be coupled to a first terminal 170 (e.g., source terminal) and second node 166 may be coupled to a second terminal 172 (e.g., drain terminal).

First and second nodes 168, 166 may include silicide, such as but not limited to, cobalt silicide or titanium silicide. First and second terminals 170, 172 may include various types of metal or metallic materials.

In an embodiment, no gate oxide layer is formed over first surface 150a of ESD device 150 and ESD device 150 does not include a gate terminal. Thus, a voltage operating range of ESD device 150 is not limited by gate oxide degradation.

Substrate 152 may include a semiconductor substrate. In some embodiments, substrate 152 may include a semiconductor material and any material used for supporting semiconductor materials. For example, substrate 152 may include, but not limited to, a semiconductor material disposed on at least one of glass, ceramic, or polymer.

In operation, in response to an ESD event, a bipolar PNP transistor may turn on or otherwise be activated in ESD device 150 and form a current path 178 from second P-type region 156 to first P-type region 168 through first N-type region 154.

In one embodiment of ESD protection device 150, first doped region 154 may include a N type well region, second doped region 158 may include a P+ type region, third doped region 156 may include a P+ type region, and fourth doped region 160 may include a N+ type region.

Figure 2:
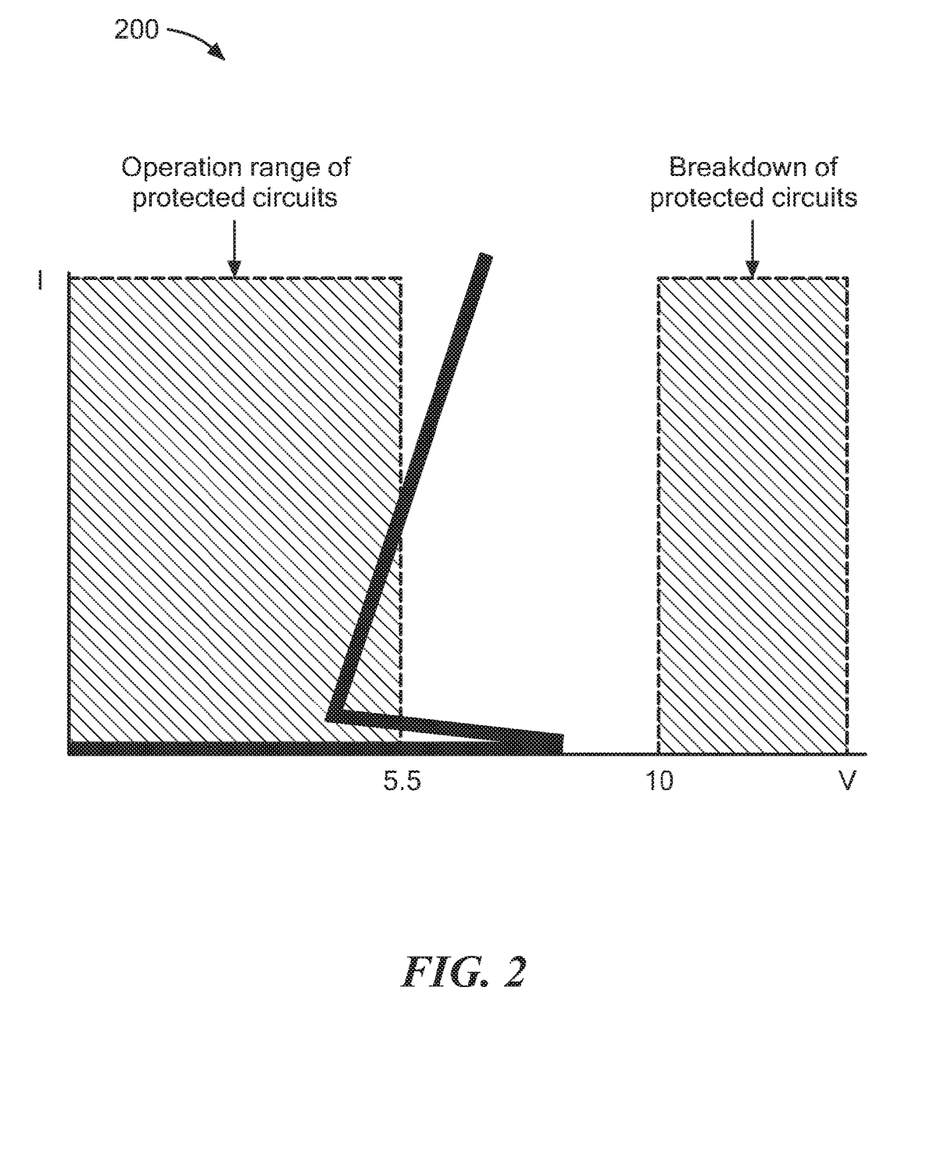
FIG. 2 is a graph of the I-V characteristics of the ESD protection structure of FIG. 1.

Now referring to FIG. 2, a graph 200 illustrating the current/voltage (I-V) characteristics of one embodiment of an ESD protection device as described herein. In graph 200, the values along the Y-axis correspond to current values and the values along the X-axis correspond to voltage values.

As stated above, ESD device 100 of FIG. 1 may be implemented in an IC to protect various circuitry within the IC from an ESD event. During the ESD event, a large amount of energy may be experienced at a drain terminal (e.g., second terminal 122 of FIG. 1) of ESD device 100 having an NMOS configuration or at a source terminal (e.g., first terminal 120 of FIG. 1) if in a PMOS configuration.

The voltage on the drain terminal 122 of the NMOS (or source terminal in a PMOS configuration) can continue to rise until an avalanche breakdown in the drain to bulk junction of the NMOS device activates the NPN transistor (e.g., bipolar transistor 150 of FIG. 1A) and the ESD protection device goes into "snapback." In ESD device 100, a maximum direct current (DC) voltage that can be sustained corresponds to the breakdown between the drain terminal and a gate terminal (e.g., $V_{dg}$). As the ESD protection devices described herein do not include a gate oxide (or gate terminal), the maximum direct current (DC) voltage the ESD protection devices can sustain is extended or greater than that of an ESD protection device having a gate oxide layer.

In graph 200, the avalanche breakdown occurs at 5.5V. Thus, ESD device 100 can trigger at a voltage above 5.5V (operating max voltage ($V_{opmax}$) of 5.5V) and stay below 10V. In an embodiment, the ESD protection devices as described herein have an extended operating up to 5.5V, as opposed to a GGNMOS ESD clamp having an operating range limited to 3.6V.

It should be appreciated that the TLP characteristics as shown in graph 200 are based on a gate-less 3.3V NMOS based (e.g., gate oxide=90 A) ESD clamp used for protection of 5V (gate oxide=150 A) CMOS devices. However, the ESD protection devices as described herein can have a variety of different operating ranges based at least in part on a particular application of the ESD protection device. For example, in some embodiments, the properties of the different layers and materials used to form a particular ESD protection device can be modified to alter an operating range of a respective ESD protection device.

Figure 3:
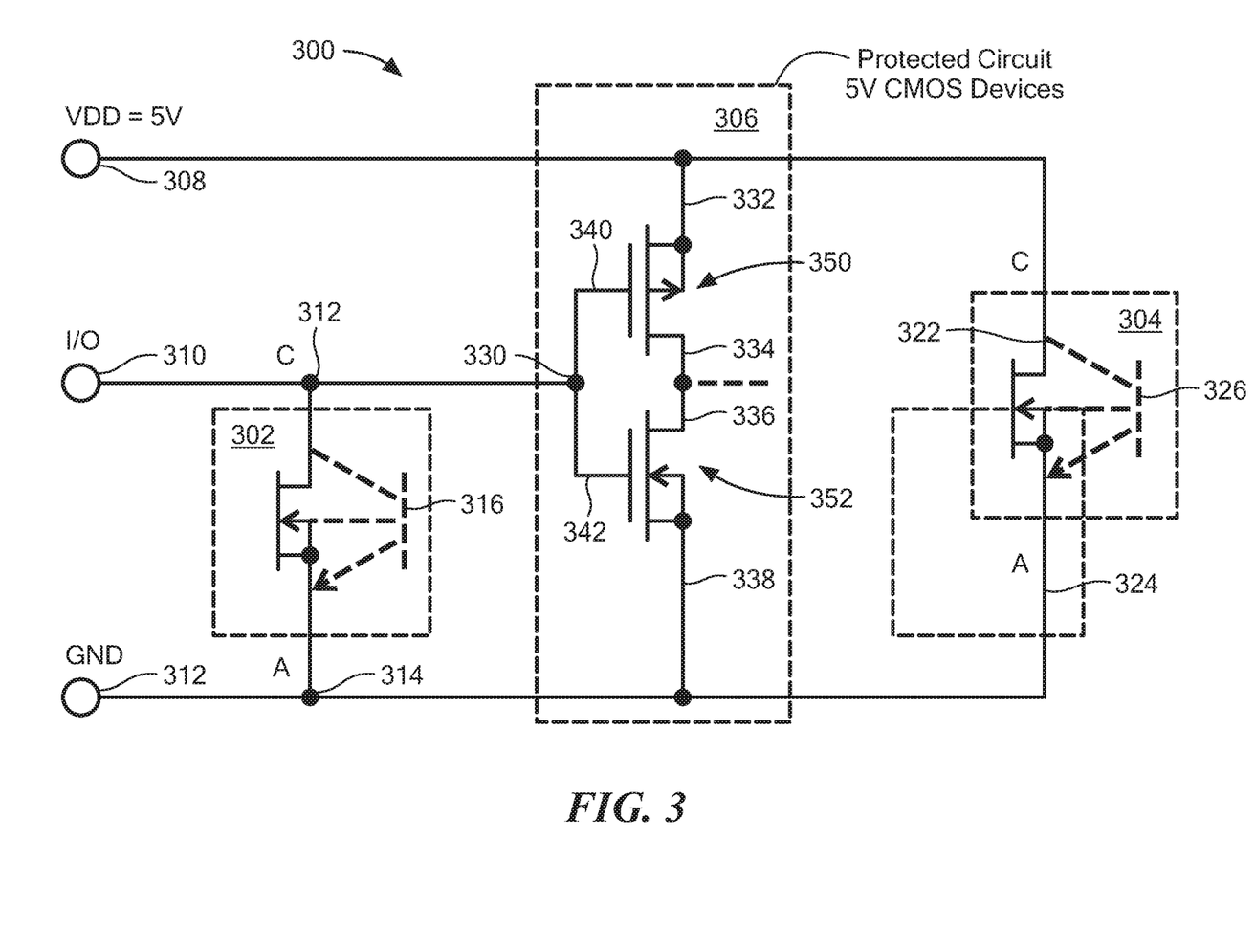
FIG. 3 is a diagram of a complementary metal-oxide-semiconductor (CMOS) circuit having two ESD protection structures.

Now referring to FIG. 3, an integrated circuit (IC) 300 includes a first ESD device 302, circuitry 306 and a second ESD device 304.

Circuitry 306 includes a first transistor structure 350 and a second transistor structure 352 coupled in series between a first reference voltage 308 (e.g., supply voltage terminal) and a second reference voltage 312 (e.g., ground terminal).

For example, first transistor structure 350 includes a first terminal 332 (e.g., source terminal) coupled to first reference voltage 308, a second terminal 340 (e.g., gate terminal) coupled to I/O terminal 310 and a third terminal 334 (e.g., drain terminal) coupled to a first terminal 336 of second transistor structure 352. A second terminal 342 (e.g., gate terminal) of second transistor structure 352 is coupled to I/O terminal 310. Thus, second terminal 340 of first transistor structure 350 and second terminal 342 of second transistor structure 352 share a common node 330 that is coupled I/O terminal 310. A third terminal 338 of second transistor structure 352 is coupled to second reference voltage 312.

First ESD device includes a first terminal 312 coupled to an input/output (I/O) terminal of IC 300 and a second terminal 314 coupled to second reference voltage 312. Second ESD device includes a first terminal 322 coupled to first reference voltage 308 and a second terminal 324 coupled to second reference voltage 312. In an embodiment, first and second ESD devices 302, 304 are disposed across an input and output, respectively of circuitry 306 to protect circuitry 306 from an ESD event.

In operation, an ESD event can deliver a spike or high amount of energy to the IC though I/O terminal 310 and/or first reference voltage 308 and potentially damage circuitry 306 within IC 300. First and second ESD devices 302, 304 are disposed across an input and output, respectively of circuitry 306 to protect circuitry 306 from the ESD event.

Each of first and second ESD devices 302, 304 can provide current paths (e.g., current path 128 of FIGS. 1-1A) to provide a safe path for current from the ESD event to flow away from circuitry 306 and, for example, flow from I/O terminal 310 and/or first reference voltage 308 to second reference voltage 312 (e.g., ground terminal).

For example, in response to an ESD event at I/O terminal 310, a bipolar transistor can turn on and form a current path 316 within first ESD device 302. The ESD event may include a voltage greater than a trigger voltage threshold of first ESD device 302. Current path 316 couples first terminal 312 to second terminal 314. First and second terminals 312, 314 may correspond to a drain terminal or a source terminal depending on particular configuration of first ESD device 302 (e.g., NMOS, PMOS). Excess current from the ESD event can be shunted from first terminal 312 to second terminal 314 through current path 316. Thus, node 330 coupled to second terminal 340 of first transistor structure 350 and second terminal 342 of second transistor structure 352 is protected from the excess current from the ESD event.

In response to an ESD event at first reference voltage 308 (e.g., supply voltage terminal), a bipolar transistor can turn on and form a current path 326 within second ESD device 304. The ESD event may include a voltage greater than a trigger voltage threshold of second ESD device 304. Current path 324 couples first terminal 322 to second terminal 324. First and second terminals 322, 324 may correspond to a drain terminal or a source terminal depending on particular configuration of second ESD device 304 (e.g., NMOS, PMOS). Excess current from the ESD event can be shunted from first terminal 322 to second terminal 324 through current path 326. Thus, first terminal 332 of first transistor structure 350 (and circuitry 306) is protected from the excess current from the ESD event.

It should be appreciated that circuitry 306 may include a circuit arrangement having one or more complementary metal oxide semiconductor (CMOS) devices, one or more bipolar devices, one or more -double diffused metal oxide semiconductor (DMOS) devices, one or more Hall-effect or magnetoresistance elements or a combination of CMOS devices, bipolar devices, DMOS devices, or Hall-effect, or magnetoresistance elements.

Figure 4:
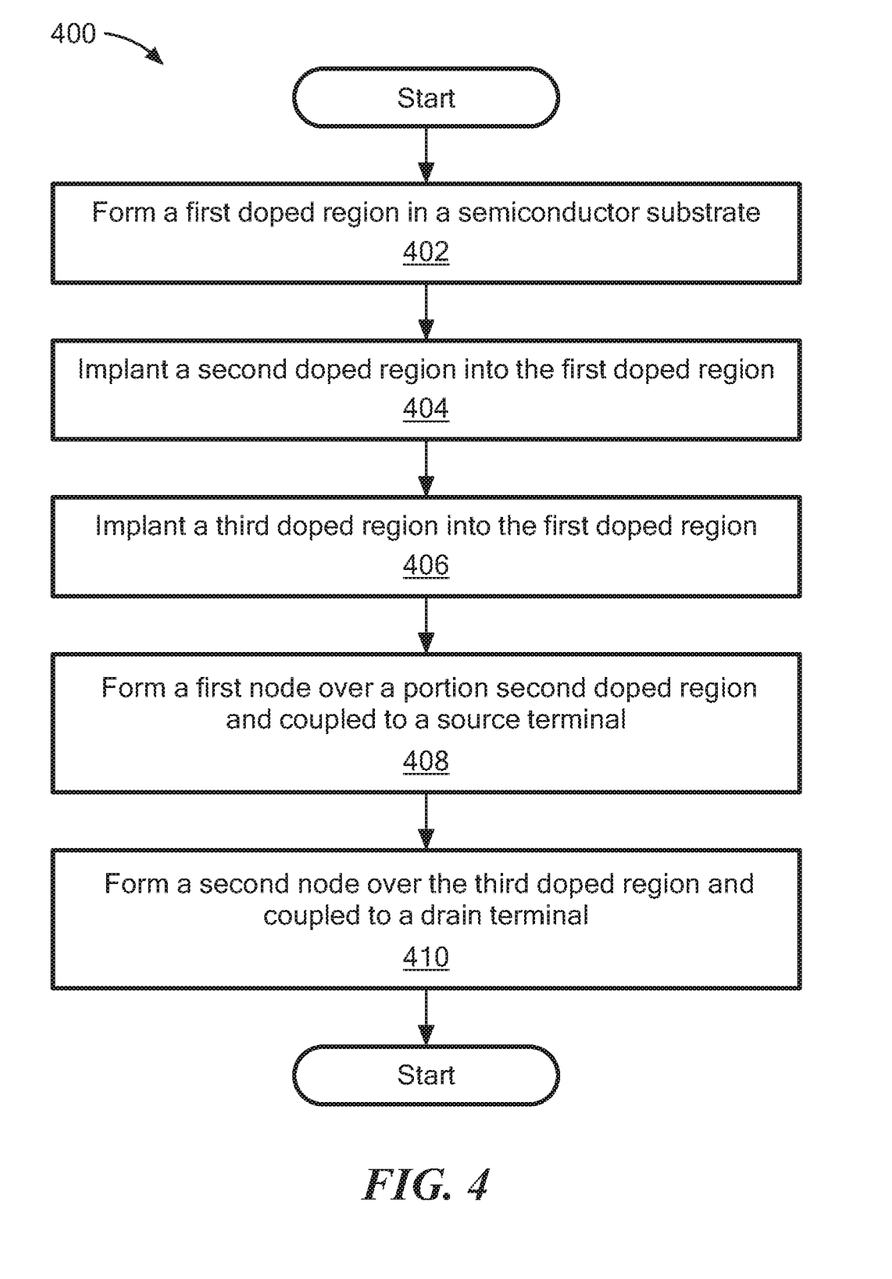
FIG. 4 is a flow diagram of a method for forming a gate-less ESD protection device.

Now referring to FIG. 4, a method 400 for forming a gate-less ESD event protection device is provided. The gate-less ESD protection device can be formed within a MOS based integrated circuit to protect inputs and/or outputs of the IC. Further, the gate-less ESD protection device can be formed such that it does not include a gate electrode over a region where a gate oxide may typically be formed. Thus, the ESD protection device does not include a gate terminal.

Method 400 begins at block 402 by forming a first doped region in a substrate (e.g., semiconductor substrate). In some embodiments, the first doped region may be formed as a well region or as an epitaxial layer in the substrate. The doping type of the first doping region can be selected based at least in part on the type of structure the ESD event protection device is formed within. For example, in a NMOS based structure, the first doped region can include a P-type region (e.g., P-type well, P-type epitaxial layer, P-type substrate). In a PMOS based structure, the first doped region can include a N-type region (e.g., N-type well, N-type epitaxial layer, N-type substrate).

In some embodiments, isolation regions (e.g., field oxide regions, STI regions, LOCOS region) may be formed or otherwise embedded in the substrate. The isolation regions may be formed along a first surface of the substrate and be spaced a predetermined distance from each other. The predetermined distance can correspond to a length or width of the first doped region relative to the first surface of the substrate.

The isolation regions may be formed prior to the first doped region. For example, the isolation regions may serve as a boundary for the first doped region and the first doped region may be formed such that a first isolation region is formed at a first end of the first doped region and a second isolation region is formed at a second end of the first doped region. In an embodiment, isolation regions may be formed to provide boundaries between the various regions of the ESD device. Thus, the first doped region may be implanted before isolation regions, in which case it is not defined by them, or it may be implanted after isolation regions are formed, in which case it may be defined by isolation boundaries.

In some embodiments, a gate electrode may not be formed over an oxide layer as part of method 400. For example, the oxide layer may be formed over one or more portions of the first surface of the substrate and/or first doped region as part of standard CMOS processing. The oxide layer may be formed over the first doped region and not formed over the isolation regions and no gate electrode may be formed over the oxide layer. In some embodiments, the oxide layer may be removed during method 400 from one or more portions of first surface of the substrate and/or first doped region. Thus, the ESD protection device does not include a gate electrode in final form.

In some embodiments, a polysilicon layer may not be formed as part of method 400. In other embodiments, a polysilicon layer may be formed over one or more portions of the first surface of the substrate and/or first doped region as part of standard CMOS processing. For example, polysilicon may be used to construct polysilicon (film) resistors. However, the polysilicon layer may be removed locally over the gate-less MOS transistor during a poly patterning. For example, the polysilicon layer (e.g., gate material, metal) may be removed over the channel region of the gate-less ESD protection device.

One or more LDD layers may be implanted into the first doped region. The LDD layers may be formed along a first surface of the first doped region and aligned with the isolation regions. For example, a first LDD layer and a second LDD layer can be formed along the first surface of the first doped region and spaced apart from each other. In some embodiments, the LDD layers may be formed using an LDD mask.

At block 404, a second doped region is implanted into the first doped region. The second doped region can be formed adjacent to one of the LDD layers. In some embodiments, the second doped region may correspond to a source terminal of the ESD protection device. The second doped region can be formed along the first surface of the first doped region such that it is between a first isolation region and a first LDD layer.

The doping type of the second doping region can be selected based at least in part on the type of structure the ESD event protection device is formed within. For example, in a NMOS based structure, the second doped region can include a N-type region (e.g., N+ type, N− type). In a PMOS based structure, the second doped region can include a P-type region (e.g., P+ type, P− type).

At block 406, a third doped region is implanted into the first doped region. The third doped region can be formed adjacent to one of the LDD layers (different from the LDD layer adjacent to the second doped region). In some embodiments, the third doped region may correspond to a drain terminal of the ESD protection device. The third doped region can be formed along the first surface of the first doped region such that it is between a second isolation region and a second LDD layer.

The doping type of the third doping region can be selected based at least in part on the type of structure the ESD event protection device is formed within. For example, in a NMOS based structure, the third doped region can include a N-type region (e.g., N+ type, N− type). In a PMOS based structure, the third doped region can include a P-type region (e.g., P+ type, P− type).

The second and third doped regions can be formed along the first surface of the first doped region and spaced apart from each other. The spacing can correspond to the spacing between the first and second LDD layers.

In some embodiments, a fourth doped region may be implanted into the first doped region. The fourth doped region can be formed between at least one isolation region and the second doped region along the first surface of the first doped region. In some embodiments, the fourth doped region may correspond to a body terminal of the ESD protection device.

At block 408, a first node is formed over portions of the first doped region, second doped region and the fourth doped region. In one embodiment, the first node covers a first surface of the second and fourth doped regions and covers a portion of the first doped region between the second and fourth doped regions. The first node may be coupled to a source terminal. The first node may include a silicide layer (e.g., cobalt silicide or titanium silicide) formed over the second doped region.

The silicide layer can be used to enhance a conductivity of the contact regions to be formed over the first, second and fourth doped region. For example, a first terminal can be coupled to the first node. The first terminal may correspond to the source terminal. The first terminal may include various types of metal or metallic materials.

At block 410, a second node is formed over portions (e.g., not the entire first surface) of the third doped region and is coupled to a drain terminal. The second node may include a silicide layer (e.g., cobalt silicide or titanium silicide) formed over the portions of the third doped regions.

The silicide layer can be used to enhance a conductivity of a contact region to be formed over the third doped region.

For example, a second terminal can be coupled to the second node. The second terminal may correspond to a drain terminal. The second terminal may include various types of metal or metallic materials.

In some embodiments, the silicide layers can be formed using a selective silicidation techniques. For example, a patterning process may use a silicide block masking step to selective dispose the silicide layers on portions of the first, second, and/or third doped regions.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed:

1. A gate-less electrostatic discharge (ESD) event protection device comprising:
   a substrate;
   a first doped region comprising a first P-type region formed in the substrate;
   a second doped region comprising a first N-type region extending into the first doped region;
   a third doped region comprising a second N-type region extending into the first doped region;
   a first node formed over a portion of the second doped region and coupled to a source terminal of a MOS-based structure; and
   a second node formed over the third doped region and coupled to a drain terminal of the MOS-based structure, wherein the device does not include a gate electrode;
   a first low doped drain (LDD) layer extending into the first P-type region and adjacent to the first N-type region; and
   a second low doped drain (LDD) layer extending into the first P-type region and adjacent to the second N-type region.

2. The device of claim 1, further comprising the first node coupled to a first reference voltage and the second node coupled to a second reference voltage.

3. The device of claim 2, wherein the first reference voltage is a ground terminal and the second reference voltage is a voltage supply terminal.

4. The device of claim 1, wherein the first P-type region and the first and second N-type regions form a bipolar NPN transistor within the substrate in response to an ESD event.

5. The device of claim 4, wherein the first P-type region and the first and second N-type regions form a current path from the first node to the second node in response to an ESD event having a voltage above a trigger voltage threshold.

6. The device of claim 5, wherein the trigger voltage threshold corresponds to one or more of a material of the first doped region, a material of the second doped region, a material of the third doped region or a location of each of the first doped region, the second doped region and third doped region with respect to each other.

7. The device of claim 5, wherein the trigger voltage threshold corresponds to a doping level of one or more of the first doped region, a material of the second doped region, or a material of the third doped region.

8. The device of claim 1, further comprising a second P-type region extending into the first P-type region and adjacent to the first N-type region.

9. The device of claim 8, wherein the second node is formed over the second N-type region and the first P-type region.

10. The device of claim 1, further comprising first and second isolation regions, wherein first portions of the first and second isolation regions extend into the first P-type region and second portions of the first and second isolation regions different than the first portions of the first and second isolation regions extend into the substrate.

11. The device of claim 10, wherein the first isolation region is formed adjacent to the second N-type region and the second isolation region is formed adjacent to a second P-type region extending into the first P-type region and adjacent to the first N-type region.

12. The device of claim 10, wherein the first and second isolation regions comprise at least one of a shallow trench isolation (STI) region or a local oxidation of silicon (LOCOS) region.

13. An electrostatic discharge (ESD) event protection circuit comprising:
a first gate-less ESD event protection device having a first terminal coupled to an input/output (I/O) terminal of the circuit and a second terminal coupled to a reference voltage;
a second gate-less ESD protection device having a first terminal coupled to a power supply and a second terminal coupled to the reference voltage; and
a circuit arrangement disposed between the first and second gate-less ESD event protection devices such that the first terminal of the first gate-less ESD event protection device is coupled to an input of the circuit arrangement and the first terminal of the second gate-less ESD event protection device is coupled to an output of the circuit arrangement, wherein each of the first and second gate-less ESD protection devices do not include a gate electrode;
wherein each of the first and second gate-less ESD protection devices comprises:
a substrate;
a first P-type region formed in the substrate;
a first N-type region extending into the first P-type region;
a second N-type region extending into the first P-type region;
a first node formed over the first N-type region and coupled to a source terminal of a MOS-based structure; and
a second node formed over the second N-type region and coupled to a drain terminal of the MOS-based structure.

14. The circuit of claim 13, wherein the circuit arrangement comprises one or more complementary metal oxide semiconductor (CMOS) devices, one or more bipolar CMOS devices, one or more bipolar CMOS-double diffused metal oxide semiconductor (DMOS) devices, or one or more magnetoresistance elements.

15. The circuit of claim 13, wherein the first gate-less ESD event protection device is positioned to drain current associated with an ESD event on the I/O terminal and the second gate-less ESD event protection device is positioned to drain current associated with an ESD event on the power supply.

16. The circuit of claim 13, wherein, in each of the first and second gate-less ESD protection devices, the first P-type region and first and second N-type regions form a bipolar NPN transistor within the substrate in response to an ESD event.

17. The circuit of claim 16, wherein, in each of the first and second gate-less ESD protection devices, the first P-type region and first and second N-type regions form a current path from the first node to the second node in response to an ESD event having a voltage above a trigger voltage threshold.

18. The circuit of claim 13, further comprising, in each of the first and second gate-less ESD protection devices, a second P-type region extending into the first P-type region and adjacent to the first N-type region.

19. The circuit of claim 18, wherein, in each of the first and second gate-less ESD protection devices, the second node is formed over the second N-type region and the first P-type region.

20. The circuit of claim 13, further comprising, in each of the first and second gate-less ESD protection devices, first and second isolation regions, wherein first portions of the first and second isolation regions extend into the first P-type region and second portions of the first and second isolation regions different than the first portions of the first and second isolation regions extend into the substrate.

21. The circuit of claim 20, wherein, in each of the first and second gate-less ESD protection devices, the first isolation region is formed adjacent to the second N-type region and the second isolation region is formed adjacent to a second P-type region extending into the first P-type region and adjacent to the first N-type region.

22. The circuit of claim 20, wherein the first and second isolation regions comprise at least one of a field oxide region, a shallow trench isolation (STI) region or a local oxidation of silicon (LOCOS) region.

23. The circuit of claim 13, further comprising, in each of the first and second gate-less ESD protection devices, a first low doped drain (LDD) layer extending into the first P-type region and adjacent to the first N-type region and a second low doped drain (LDD) layer extending into the first P-type region and adjacent to the second N-type region.

* * * * *

UNITED STATES PATENT AND TRADEMARK OFFICE
CERTIFICATE OF CORRECTION

PATENT NO. : 10,256,225 B2
APPLICATION NO. : 15/601141
DATED : April 9, 2019
INVENTOR(S) : Maxim Klebanov et al.

It is certified that error appears in the above-identified patent and that said Letters Patent is hereby corrected as shown below:

In the Specification

Column 1, Line 57, delete "applications" and replace with --application--.

Column 2, Line 27, delete "include" and replace with --includes--.

Column 5, Lines 45-46, delete "correspond a" and replace with --correspond to a--.

Column 8, Line 22, delete "of" and replace with --on--.

Column 11, Line 4, delete "coupled" and replace with --coupled to--.

Column 14, Line 6, delete "using a selective" and replace with --using selective--.

Column 14, Line 8, delete "selective" and replace with --selectively--.

Signed and Sealed this
Twenty-fifth Day of June, 2019

Andrei Iancu
*Director of the United States Patent and Trademark Office*